United States Patent
Doman

(10) Patent No.: US 9,147,658 B2
(45) Date of Patent: Sep. 29, 2015

(54) STACKED POWER SUPPLIES FOR INTEGRATED CIRCUIT DEVICES AND METHODS OF MAKING THE SAME

(75) Inventor: David S. Doman, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1010 days.

(21) Appl. No.: 13/279,687

(22) Filed: Oct. 24, 2011

(65) Prior Publication Data

US 2013/0100590 A1 Apr. 25, 2013

(51) Int. Cl.
*H02J 1/00* (2006.01)
*H02J 3/00* (2006.01)
*H01L 23/528* (2006.01)

(52) U.S. Cl.
CPC ..... *H01L 23/5286* (2013.01); *H01L 2924/0002* (2013.01)

(58) Field of Classification Search
CPC ................ H01L 23/5286; H01L 2924/0002; H01L 2924/00
USPC ...................... 307/43, 72; 257/349
See application file for complete search history.

(56) References Cited

U.S. PATENT DOCUMENTS

| | | | |
|---|---|---|---|
| 4,388,534 A | 6/1983 | Love et al. | |
| 4,564,767 A | 1/1986 | Charych | |
| 6,795,322 B2 | 9/2004 | Aihara et al. | |
| 6,977,833 B2 * | 12/2005 | Day et al. | 365/52 |
| 7,053,502 B2 | 5/2006 | Aihara et al. | |
| 7,652,333 B2 | 1/2010 | Ozawa et al. | |
| 7,843,089 B2 * | 11/2010 | Ito et al. | 307/147 |
| 2003/0090158 A1 | 5/2003 | Fauh et al. | |
| 2006/0181857 A1 * | 8/2006 | Belady et al. | 361/719 |
| 2008/0019203 A1 * | 1/2008 | Ito et al. | 365/226 |
| 2010/0090282 A1 * | 4/2010 | Ozawa et al. | 257/349 |

* cited by examiner

*Primary Examiner* — Rexford Barnie
*Assistant Examiner* — Rasem Mourad
(74) *Attorney, Agent, or Firm* — Amerson Law Firm, PLLC

(57) ABSTRACT

Disclosed herein are integrated circuit devices having stacked power supplies and methods of making such integrated circuit devices. In one example, the device includes a first power supply structure, a second power supply structure electrically isolated from the first power supply structure, wherein at least a portion of the second power supply structure is positioned vertically below at least a portion of the first power supply structure, wherein the first power supply structure is one of an interruptible or an uninterruptible power supply structure, while the second power supply structure is the other of the interruptible or the uninterruptible power supply structure, a plurality of constant-power circuits conductively coupled to whichever of the first or second power supply structure that is the uninterruptible power supply and a plurality of interruptible-power circuits conductively coupled to whichever of the first or second power supply structure that is the interruptible power supply.

22 Claims, 3 Drawing Sheets

220U

220I

220I

220U

220U

223

220I

STACKED POWER SUPPLIES FOR INTEGRATED CIRCUIT DEVICES AND METHODS OF MAKING THE SAME

BACKGROUND OF THE INVENTION

1. Field of the Invention

Generally, the present disclosure generally relates to the manufacturing of sophisticated semiconductor devices, and, more specifically, to integrated circuit devices have stacked power supplies and various methods of making such integrated circuit devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. Other semiconductor devices include, for example, resistors, capacitors, diodes, so-called FinFet transistors, etc. These various semiconductor devices may be arranged in a variety of unique circuit configurations such that each circuit performs a desired function for the integrated circuit device.

Over recent years, there has been a constant drive to reduce the physical size of various consumer electronic products that employ integrated circuits. Perhaps the best example of this trend is the evolution of the cell phone. Early versions of the cell phone were physically very large and bulky, and provided relatively limited functionality, while current day smart phones are very small and provide a great deal of functionality. The demand for smaller consumer products with greater capability has resulted in the scaling or reduction in the physical size of integrated circuit devices that are employed in such consumer products. The reduction in size of the integrated circuit products has been achieved by, among other things, reducing the physical size of the various semiconductor devices, e.g., the transistors, and by greatly increasing the density of such transistors on a given area of a semiconducting substrate or chip.

Power consumption by an integrated circuit device is a very important parameter in terms of product design and performance. Excessive power consumption may lead to increased heating of the integrated circuit, which may reduce device performance. In the case of portable electronic devices, excessive power consumption may lead to reduced operating times for the consumer product.

Device designers have used a variety of techniques to try to manage the power consumption by integrated circuit products. One of these techniques involves providing both a constant or uninterruptible power supply and a varying or interruptible power supply on an integrated circuit device. This technique further involves identifying some circuits which need to be coupled to the constant or uninterruptible power supply and identifying other circuits that can operate by being coupled to the varying or interruptible power supply, so that constant power is not supplied to all of the circuits on an integrated circuit device. Examples of circuits 12 that are typically coupled to a constant power supply include communication monitoring circuitry in cell phones, battery monitoring circuitry in many wireless products and life critical monitoring circuitry in portable medical products. Examples of circuits 14 that are typically couple to an interruptible power supply include image capture or image projection support circuitry in cell phones and display and other human interface support circuitry in portable or non-portable medical products.

This technique will be further discussed with reference to FIG. 1A (cross-sectional view) and FIG. 1B (plan view) which depicts an illustrative prior art integrated circuit device 100. As shown therein, the device 100 is generally comprised of a plurality of schematically depicted circuits 12 that require connection to an uninterruptible power supply 20U and a plurality of schematically depicted circuits 14 that are connected to an interruptible power supply 20I, which is laterally spaced apart from the uninterruptible power supply 20U. The circuits 12, 14 are formed in and above a semiconducting substrate 10. In the depicted example, the circuits 12 are conductively coupled to the uninterruptible power supply 20U by a schematically depicted via 15 and conductive line 13. In the depicted example, the circuits 14 are conductively coupled to the interruptible power supply 20I by a schematically depicted via 19 and conductive line 17. The various conductive structures 15, 13, 20U, 19, 17, 20I are formed in one or more layers of insulating material 11, they may be comprised of a variety of conductive materials, e.g., a metal, and they may be formed using a variety of known techniques.

The present disclosure is directed to integrated circuit devices having stacked power supplies and various methods of making such integrated circuit devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to integrated circuit devices have stacked power supplies and various methods of making such integrated circuit devices. In one example, the device disclosed herein includes a first power supply structure, a second power supply structure that is electrically isolated from the first power supply structure, wherein at least a portion of the second power supply structure is positioned vertically below at least a portion of the first power supply structure, wherein the first power supply structure is one of an interruptible power supply structure or an uninterruptible power supply structure, while the second power supply structure is the other of the interruptible power supply structure or said uninterruptible power supply structure, a plurality of constant-power circuits that are conductively coupled to whichever of the first power supply structure or said second power supply structure that is the uninterruptible power supply and a plurality of interruptible-power circuits that are conductively coupled to whichever of the first power supply structure or the second power supply structure that is the interruptible power supply.

In another illustrative example, a device disclosed herein includes an uninterruptible power supply structure comprising a first conductive metal line, an interruptible power supply structure comprising a second conductive metal line, wherein the interruptible power supply structure is electrically isolated from the uninterruptible power supply structure, and wherein at least a portion of the interruptible power supply structure is positioned vertically below at least a portion of the uninterruptible power supply structure, a plurality of constant-power circuits that are conductively coupled to the uninterruptible power supply structure and a plurality of interruptible-power circuits that are conductively coupled to the interruptible power supply structure.

In another illustrative example, a device disclosed herein includes an interruptible power supply structure comprising a first conductive metal line, an uninterruptible power supply structure comprising a second conductive metal line, wherein the uninterruptible power supply structure is electrically isolated from the interruptible power supply structure, and wherein at least a portion of the uninterruptible power supply structure is positioned vertically below at least a portion of the interruptible power supply structure, a plurality of constant-power circuits that are conductively coupled to the uninterruptible power supply structure and a plurality of interruptible-power circuits that are conductively coupled to the interruptible power supply structure.

Another unique device disclosed herein includes a first power supply structure, a second power supply structure that is electrically isolated from the first power supply structure, wherein at least a portion of the second power supply structure is positioned vertically below at least a portion of the first power supply structure, wherein the first power supply structure is one of an interruptible power supply structure or an uninterruptible power supply structure, while the second power supply structure is the other of the interruptible power supply structure or said uninterruptible power supply structure. The device further includes a single circuit comprised of a first portion that requires constant power supply and a second portion that does not require constant power supply, wherein the first and second portions are formed adjacent one another in a semiconducting substrate. In this illustrative device the first portion of the single circuit is conductively coupled to the one of the first power supply structure or the second power supply structure that is the uninterruptible power supply and the second portion of the single circuit is conductively coupled to the one of the first power supply structure or the second power supply structure that is the interruptible power supply.

BRIEF DESCRIPTION OF THE DRAWINGS

The disclosure may be understood by reference to the following description taken in conjunction with the accompanying drawings, in which like reference numerals identify like elements, and in which.

Figure 1A:
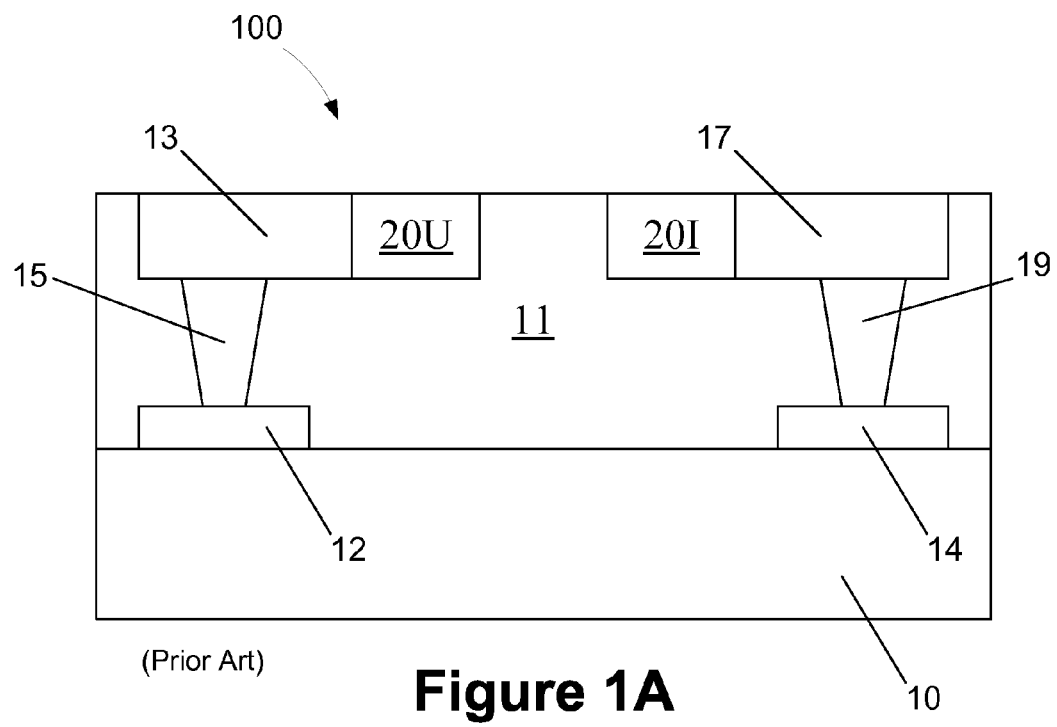
FIGS. 1A-1B depict one illustrative prior art arrangement of interruptible and non-interruptible power supplies on an integrated circuit device.
Figure 1B:
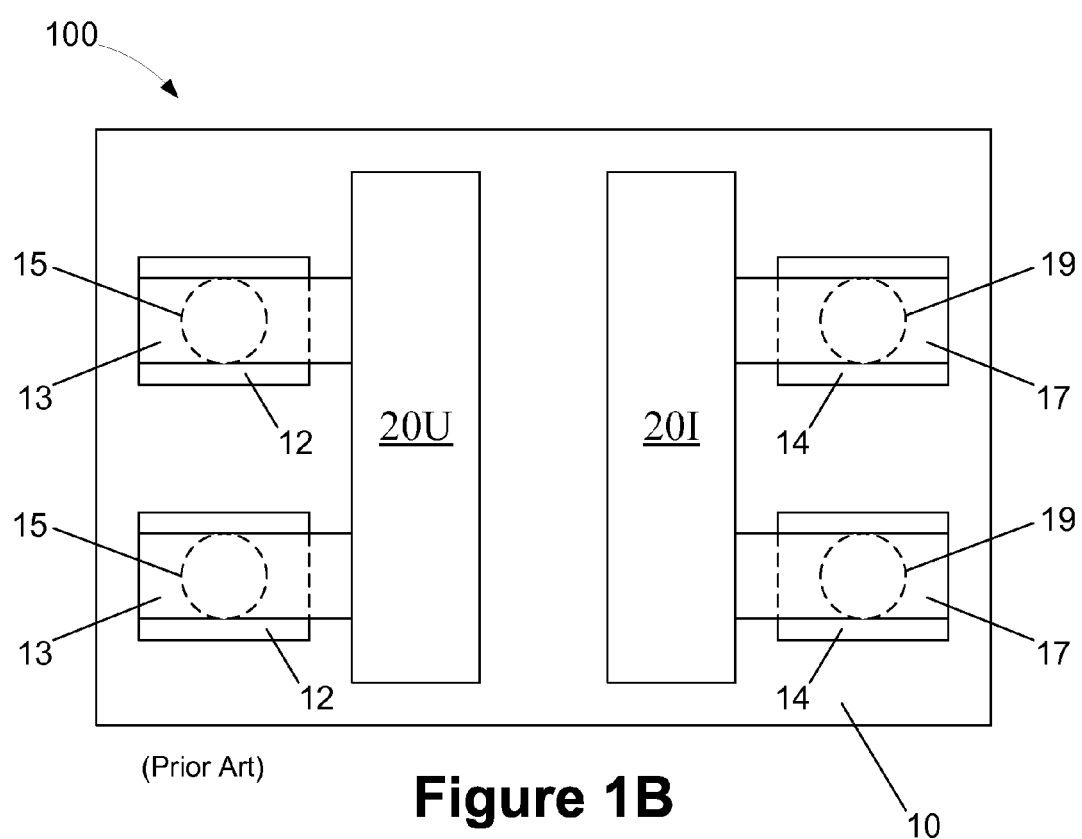

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to integrated circuit devices have stacked power supplies and various methods of making such integrated circuit devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, ASICs, logic devices, memory devices, etc. With reference to FIGS. 2A-2E various illustrative embodiments of the methods and devices disclosed herein will now be described in more detail. To the extent that the same reference numbers are used in both FIGS. 1A-1B and FIGS. 2A-2E, the previous description of those structures applies equally to FIGS. 2A-2E.

Figure 2A:
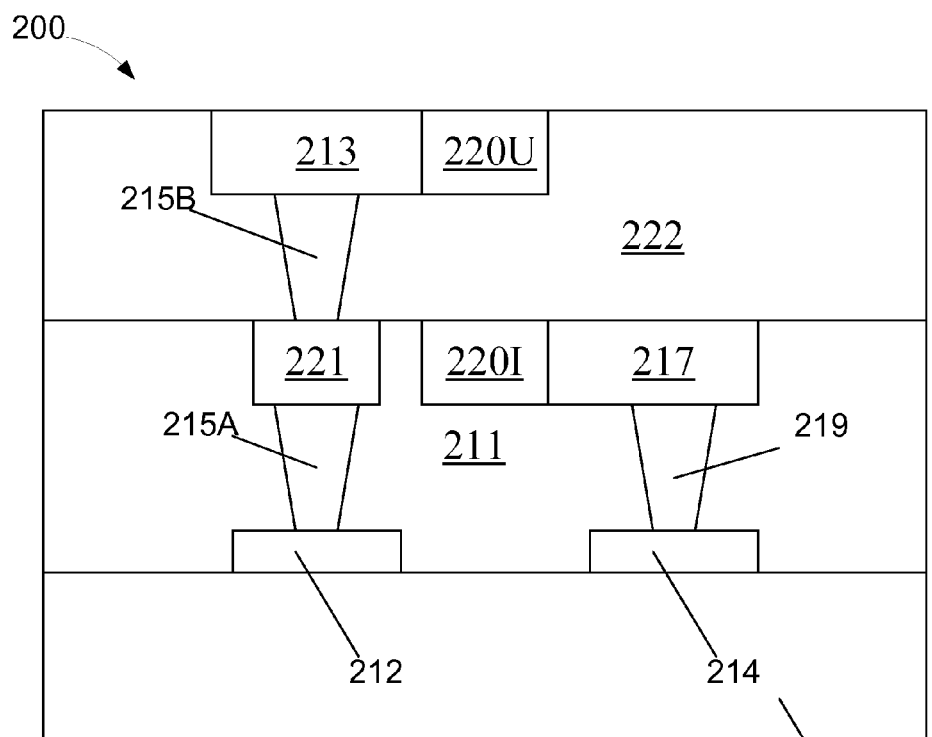
FIGS. 2A-2E depict various illustrative examples of integrated circuit devices have stacked power supplies and various methods of making such integrated circuit devices.
Figure 2B:
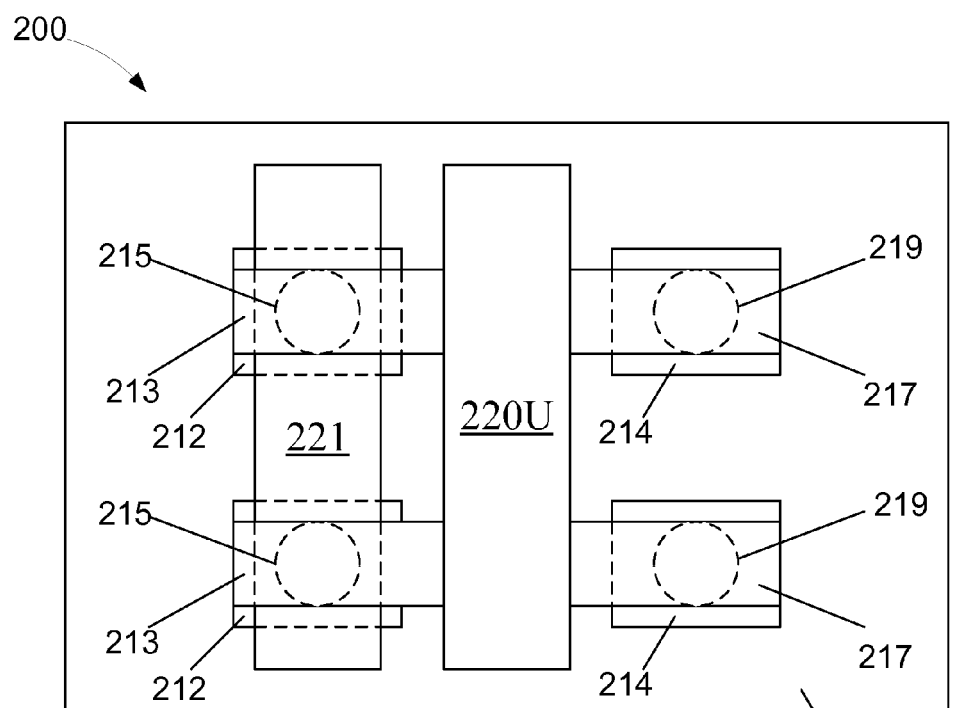

FIG. 2A (a simplified cross-sectional view) and FIG. 2B (a simplified plan view—without the insulating materials) depict an illustrative semiconductor device 200 at an early stage of manufacturing. The device 200 is formed above a semiconducting substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

As shown in FIGS. 2A-2B, the device 200 is generally comprised of a plurality of schematically depicted constant-power circuits 212 wherein at least some portion of the constant-power circuit 212 requires connection to an uninterruptible power supply structure 220U, and a plurality of schematically depicted interruptible-power circuits 214 wherein at least some portion or aspect of the circuit 214 are connected to an interruptible power supply structure 220I. The power sources for the uninterruptible power supply structure 220U and the interruptible power supply structure 220I are not depicted in the drawings. As those skilled in the art will recognize after a complete reading of the present application, identifying a circuit "constant-power circuit"does not mean that all aspects or functionality of the constant-power circuit 212 needs to be connected to the uninterruptible power supply structure 220U, although that may be the case in some applications. That is, it may be the case that only portions of a constant-power circuit 212 needs to be connected to the uninterruptible power supply structure 220U. For example, the constant-power circuit 212 and the interruptible power circuit 214 may be part of a single circuit, such as a flip-flop circuit, where portions of the single circuit (i.e., the circuit 214) can be connected to the interruptible supply structure 220I while only the latch (i.e., the circuit 212) storing the state of the flip-flop needs to be connected to the uninterruptible power supply structure 220U. Similarly, identifying a circuit "interruptible-power circuit" does not mean that all aspects or functionality of the interruptible-power circuits 214 can or is connected to the interruptible power supply structure 220I, although that may be the case in some applications. That is, in some cases only portions of the interruptible-power circuits 214, although that may be the case in some applications may be connected to the interruptible power supply structure 220I. Illustrative examples of constant-power circuits 212 that may be coupled to the constant power supply structure 220U include master latches in otherwise interruptible power supply flip-flops, also known as state-retention flip-flops. Illustrative examples of interruptible-power circuits 214 that may be coupled to the interruptible power supply 220I include all remaining circuitry between state retention flip-flops, including the parts of the flip-flops that does not require constant power supply. The circuits 212, 214 are formed in and above the semiconducting substrate 10.

In the depicted example, the constant-power circuits 212 are conductively coupled to the uninterruptible power supply structure 220U by schematically depicted conductive vias 215A, 215B and conductive lines 221, 213. In the depicted example, the interruptible-power circuits 214 are conductively coupled to the interruptible power supply structure 220I by a schematically depicted conductive via 219 and a conductive line 217. The various conductive structures 215A, 221, 219, 217 and 220I are formed in an illustrative layer of insulating material 211, while the various conductive structures 215B, 213 and 220U are formed in an illustrative layer of insulating material 222. The various conductive structures 215A, 221, 219, 217, 220I, 213 and 220U may be comprised of a variety of conductive materials, e.g., a metal, and they may be formed using a variety of known techniques. The layers of insulating material 211, 222 may be comprised of a variety of different materials as well, e.g., silicon dioxide, a so-called low-k material (k value less than 3.7), etc.

In the novel device 200 disclosed herein, the uninterruptible power supply structure 220U and the interruptible power supply structure 220I are electrically isolated from one another and, to at least some degree, vertically positioned over one another or vertically stacked. This stacked arrangement of the power supply structures 220U and 220I conserves valuable plot space on the device 200, which is a highly desirable attribute in designing and manufacturing modern integrated circuit devices. In the depicted embodiment, the uninterruptible power supply structure 220U is positioned above the interruptible power supply structure 220I, and they are both the same size and shape. However, as those skilled in the art will recognize after a complete reading of the present application, the stacking arrangement could be reversed, i.e., the interruptible power supply structure 220I could be positioned above the uninterruptible power supply structure 220U, and the size and shape of the power supply structures 220U, 220I may be different from one another.

Figures 2C, 2D, 2E:
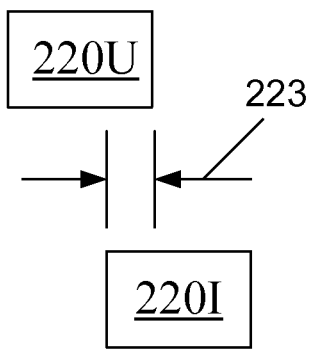

For example, FIG. 2C depicts the illustrative example wherein the uninterruptible power supply structure 220U is positioned above the interruptible power supply structure 220I, but the interruptible power supply structure 220I is physically wider than the uninterruptible power supply structure 220U. FIG. 2C also depicts an illustrative example wherein the uninterruptible power supply structure 220U covers less that the entirety of the width of the interruptible power supply structure 220I.

In the example depicted in FIG. 2D, the uninterruptible power supply structure 220U is taller and narrower than the interruptible power supply structure 220I. FIG. 2D also depicts an illustrative example where the interruptible power supply structure 220I is positioned above the uninterruptible power supply structure 220U.

FIG. 2E depicts one example where there where there is a partial overlap of the two power supply structures, e.g., where the uninterruptible power supply structure 220U partially overlaps the interruptible power supply structure 220I by an amount 223.

Another unique device disclosed herein includes a device wherein different portions of a single circuit, such as a flip-flop circuit, that have different power-supply requirements may be formed physically adjacent to one another in a semiconducting substrate. Such a device allows for more efficient routing of conductive lines and more efficient use of precious plot space on the semiconducting substrate. In one example, such a device may include the uninterruptible power supply structure 220U, the interruptible power supply structure 220I, and a single circuit that is comprised of a first portion that requires constant power supply and a second portion that does not require constant power supply, wherein the first portion of the single circuit, e.g., the latch, is conductively coupled to the uninterruptible power supply structure 220U while the second portion of the single circuit is conductively coupled to the interruptible power supply structure 220I.

The various circuits 212, 214 may be conductively coupled to the power supply structures 220U, 220I, respectively, by a variety of known conductive lines and vias that may be formed in multiple layers of insulating material formed above the substrate 10 using a variety of know techniques for forming such conductive structures, e.g., damascene techniques, etc.

The power supply structures 220U, 220I may be formed at any level of the integrated circuit device 200, i.e., they need not be positioned in immediately adjacent layers of material, although that may be the case in some applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
    a semiconducting substrate;
    a first power supply structure disposed in a first layer of insulating material formed above said semiconducting substrate;

a second power supply structure disposed in a second layer of insulating material formed above said semiconducting substrate that is electrically isolated from said first power supply structure in a vertical direction by at least one of said first or second layers of insulating materials, wherein at least a portion of said second power supply structure is positioned vertically below at least a portion of said first power supply structure, said first power supply structure being one of an interruptible power supply structure or an uninterruptible power supply structure, said second power supply structure being the other of said interruptible power supply structure or said uninterruptible power supply structure;

a plurality of constant-power circuits conductively coupled to the one of said first power supply structure or said second power supply structure that is said uninterruptible power supply; and a plurality of interruptible-power circuits conductively coupled to the one of said first power supply structure or said second power supply structure that is said interruptible power supply.

2. The device of claim 1, wherein said plurality of constant-power circuits are conductively coupled to the one of said first power supply structure or said second power supply structure by at least one conductive line and at least one conductive via.

3. The device of claim 1, wherein said plurality of interruptible-power circuits are conductively coupled to the one of said first power supply structure or said second power supply structure by at least one conductive line and at least one conductive via.

4. The device of claim 1, wherein said first power supply structure is said interruptible power supply structure and said second power supply structure is said uninterruptible power supply structure, and wherein said plurality of interruptible-power circuits are conductively coupled to said first power supply structure and said plurality of constant-power circuits are conductively coupled to the said second power supply structure.

5. The device of claim 1, wherein said first power supply structure is said uninterruptible power supply structure and said second power supply structure is said interruptible power supply structure, and wherein said plurality of interruptible-power circuits are conductively coupled to said second power supply structure and said plurality of constant-power circuits are conductively coupled to the said first power supply structure.

6. The device of claim 1, wherein said first and second power supply structures have the same physical dimensions.

7. The device of claim 1, wherein said first and second power supply structures have different physical dimensions.

8. The device of claim 1, wherein said first power supply structure has a width that is greater than a width of said second power supply structure, wherein said first power supply structure is positioned above the entire width of said second power supply structure.

9. The device of claim 1, wherein said first power supply structure has a width that is less than a width of said second power supply structure, wherein said first power supply structure is positioned above less than the entire width of said second power supply structure.

10. The device of claim 1, wherein said first and second power supply structures are conductive metal lines.

11. A device, comprising:
a semiconducting substrate;

an uninterruptible power supply structure comprising a first conductive metal line disposed in a first layer of insulating material formed above said semiconducting substrate;

an interruptible power supply structure comprising a second conductive metal line disposed in a second layer of insulating material formed above said semiconducting substrate, said interruptible power supply structure being electrically isolated from said uninterruptible power supply structure in a vertical direction by at least one of said first or second layers of insulating materials, wherein at least a portion of said interruptible power supply structure is positioned vertically below at least a portion of said uninterruptible power supply structure;

a plurality of constant-power circuits conductively coupled to said uninterruptible power supply structure; and a plurality of interruptible-power circuits conductively coupled to said interruptible power supply structure.

12. The device of claim 11, wherein said plurality of constant-power circuits are conductively coupled to said uninterruptible power supply structure by at least one conductive line and at least one conductive via.

13. The device of claim 11, wherein said plurality of interruptible-power circuits are conductively coupled to said interruptible power supply structure by at least one conductive line and at least one conductive via.

14. The device of claim 11, wherein said uninterruptible power supply structure has a width that is greater than a width of said interruptible power supply structure, wherein said uninterruptible power supply structure is positioned above the entire width of said interruptible power supply structure.

15. The device of claim 11, wherein said uninterruptible power supply structure has a width that is less than a width of said interruptible power supply structure, wherein said uninterruptible power supply structure is positioned above less than the entire width of said interruptible power supply structure.

16. A device, comprising:
a semiconducting substrate;

an interruptible power supply structure comprising a first conductive metal line disposed in a first layer of insulating material formed above said semiconducting substrate;

an uninterruptible power supply structure comprising a second conductive metal line disposed in a second layer of insulating material formed above said semiconducting substrate, said uninterruptible power supply structure being electrically isolated from said interruptible power supply structure in a vertical direction by at least one of said first or second layers of insulating materials, wherein at least a portion of said uninterruptible power supply structure is positioned vertically below at least a portion of said interruptible power supply structure;

a plurality of constant-power circuits conductively coupled to said uninterruptible power supply structure; and a plurality of interruptible-power circuits conductively coupled to said interruptible power supply structure.

17. The device of claim 16, wherein said plurality of constant-power circuits are conductively coupled to said uninterruptible power supply structure by at least one conductive line and at least one conductive via.

18. The device of claim 16, wherein said plurality of interruptible-power circuits are conductively coupled to said interruptible power supply structure by at least one conductive line and at least one conductive via.

19. The device of claim 16, wherein said interruptible power supply structure has a width that is greater than a width of said uninterruptible power supply structure, wherein said interruptible power supply structure is positioned above the entire width of said uninterruptible power supply structure.

20. The device of claim 16, wherein said interruptible power supply structure has a width that is less than a width of said uninterruptible power supply structure, wherein said interruptible power supply structure is positioned above less than the entire width of said uninterruptible power supply structure.

21. A device, comprising:
a semiconducting substrate;
a first power supply structure disposed in a first layer of insulating material formed above said semiconducting substrate;
a second power supply structure disposed in a second layer of insulating material formed above said semiconducting substrate that is electrically isolated from said first power supply structure in a vertical direction by at least one of said first or second layers of insulating materials, wherein at least a portion of said second power supply structure is positioned vertically below at least a portion of said first power supply structure, said first power supply structure being one of an interruptible power supply structure or an uninterruptible power supply structure, said second power supply structure being the other of said interruptible power supply structure or said uninterruptible power supply structure;
a single circuit comprised of a first portion that requires constant power supply and a second portion that does not require constant power supply, wherein said first and second portions are formed adjacent one another in a semiconducting substrate, and wherein said first portion of said circuit is conductively coupled to the one of said first power supply structure or said second power supply structure that is said uninterruptible power supply and the second portion of said single circuit is conductively coupled to the one of said first power supply structure or said second power supply structure that is said interruptible power supply.

22. The device of claim 21, wherein said single circuit is a flip-flop circuit and said first portion is a latch of said flip-flop circuit.

* * * * *